(12) United States Patent
Faul

(10) Patent No.: US 11,764,122 B2
(45) Date of Patent: Sep. 19, 2023

(54) 3D FLEX-FOIL PACKAGE

(71) Applicant: Fraunhofer-Gesellschaft zur Foerderung der angewandten Forschung e.V., Munich (DE)

(72) Inventor: Robert Faul, Hansastrasse (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 16/803,378

(22) Filed: Feb. 27, 2020

(65) Prior Publication Data

US 2020/0279787 A1 Sep. 3, 2020

(30) Foreign Application Priority Data

Feb. 28, 2019 (DE) .......................... 102019202721.0

(51) Int. Cl.
*H01L 23/31* (2006.01)
*H01L 23/00* (2006.01)

(52) U.S. Cl.
CPC ........ *H01L 23/3164* (2013.01); *H01L 23/315* (2013.01); *H01L 23/3121* (2013.01);
(Continued)

(58) Field of Classification Search
CPC . H01L 24/16; H01L 23/49811; H01L 23/544; H01L 23/3164; H01L 23/3185; H01L 23/562; H01L 23/4985; H01L 24/29; H01L 23/3121; H01L 24/13; H01L 23/315; H01L 2224/48248; H01L 2224/81903; H01L 2924/15151; H01L 2223/54486; H01L 2224/32057; H01L 2224/131; H01L 2224/1134; H01L 2224/32257; H01L 2224/9211; H01L 2224/32225; H01L 2224/83851; H01L 2224/16238; H01L 2224/73204; H01L 2224/73265; H01L 2223/54433; H01L 2924/00014; H01L 2924/1815; H01L 2224/03436;
(Continued)

(56) References Cited

U.S. PATENT DOCUMENTS 5,956,232 A 9/1999 Zakel et al.
6,154,366 A 11/2000 Ma et al.
(Continued)

FOREIGN PATENT DOCUMENTS

CN 103219314 A * 7/2013 ............. H01L 24/86
DE 19500655 B4 7/1996
(Continued)

OTHER PUBLICATIONS

"JEDEC Standard MO-220".
(Continued)

*Primary Examiner* — Alexander O Williams
(74) *Attorney, Agent, or Firm* — Perkins Coie LLP; Michael A. Glenn

(57) ABSTRACT

A flexible foil-based package is disclosed which comprises at least one flexible foil substrate on which at least one electronic device is mounted in flip-chip mounting technology. The flexible foil substrate is bent so that a recess is created in which the electronic device is arranged. A casting compound is applied to cover the electronic device.

16 Claims, 6 Drawing Sheets

(52) U.S. Cl.
CPC .............. *H01L 24/13* (2013.01); *H01L 24/29* (2013.01); *H01L 2224/03436* (2013.01); *H01L 2224/32257* (2013.01); *H01L 2224/48248* (2013.01); *H01L 2224/73265* (2013.01)

(58) Field of Classification Search
CPC ............. H01L 2224/81; H01L 2224/83; H01L 2224/16225; H01L 2914/00; H01L 2224/73221
USPC ........................................................ 257/678
See application file for complete search history.

(56) References Cited

U.S. PATENT DOCUMENTS

| | | | |
|---|---|---|---|
| 6,492,203 B1 * | 12/2002 | Wakashima | H01L 21/4803 257/E23.004 |
| 6,617,193 B1 * | 9/2003 | Toshio | H01L 21/4803 257/678 |
| 8,563,358 B2 | 10/2013 | Landesberger et al. | |
| 9,018,742 B2 | 4/2015 | Nikitin et al. | |
| 9,692,009 B2 | 6/2017 | Lang et al. | |
| 2001/0019179 A1 | 9/2001 | Yoshino et al. | |
| 2002/0121707 A1 | 9/2002 | Pendse et al. | |
| 2003/0035275 A1 | 2/2003 | Kopf | |
| 2003/0057525 A1 | 3/2003 | Fock et al. | |
| 2004/0119166 A1 | 6/2004 | Sunohara | |
| 2004/0232528 A1 | 11/2004 | Ito et al. | |
| 2005/0087847 A1 | 4/2005 | Kuan et al. | |
| 2005/0127503 A1 | 6/2005 | Gobl et al. | |
| 2006/0138626 A1 | 6/2006 | Liew et al. | |
| 2007/0267740 A1 | 11/2007 | Khan et al. | |
| 2008/0244902 A1 | 10/2008 | Blackwell et al. | |
| 2009/0096083 A1 | 4/2009 | Augustin et al. | |
| 2009/0127638 A1 | 5/2009 | Kilger et al. | |
| 2011/0133341 A1 | 6/2011 | Shimizu et al. | |
| 2011/0233771 A1 | 9/2011 | Kwon et al. | |
| 2012/0091594 A1 | 4/2012 | Landesberger et al. | |
| 2012/0168920 A1 | 7/2012 | Tan et al. | |
| 2013/0026650 A1 | 1/2013 | Yamagata et al. | |
| 2013/0187259 A1 | 7/2013 | Nikitin et al. | |
| 2013/0313727 A1 | 11/2013 | Goh et al. | |
| 2014/0008777 A1 | 1/2014 | Loh et al. | |
| 2014/0104133 A1 | 4/2014 | Finn et al. | |
| 2015/0207101 A1 | 7/2015 | Lang et al. | |
| 2015/0221842 A1 | 8/2015 | Mima et al. | |
| 2015/0243642 A1 | 8/2015 | Chen et al. | |
| 2015/0294931 A1 | 10/2015 | Brucchi et al. | |
| 2016/0374208 A1 | 12/2016 | Chiang et al. | |
| 2017/0081175 A1 | 3/2017 | Steiert et al. | |
| 2017/0125881 A1 | 5/2017 | Mangrum et al. | |
| 2017/0207524 A1 | 7/2017 | Cardinali et al. | |
| 2017/0236776 A1 | 8/2017 | Huynh et al. | |
| 2018/0108616 A1 | 4/2018 | Chiang et al. | |
| 2018/0300597 A1 | 10/2018 | Ng et al. | |
| 2019/0334102 A1 * | 10/2019 | Fan | H01L 51/5012 |
| 2020/0014113 A1 | 1/2020 | Asaka | |
| 2020/0279787 A1 | 9/2020 | Faul | |
| 2020/0279797 A1 * | 9/2020 | Faul | H01L 23/4985 |
| 2020/0279801 A1 * | 9/2020 | Yacoub-George | H01L 23/49838 |
| 2021/0159302 A1 | 5/2021 | Choi et al. | |

FOREIGN PATENT DOCUMENTS

| | | | |
|---|---|---|---|
| DE | 19542883 C2 | 8/1996 | |
| DE | 102006044525 B3 * | 1/2008 | ......... H01L 23/5389 |
| DE | 102010042567 B3 | 3/2012 | |
| DE | 102013100339 A1 | 7/2013 | |
| DE | 102012214411 A1 | 2/2014 | |
| DE | 102014208958 A1 | 11/2015 | |
| EP | 0920056 A2 | 6/1999 | |
| EP | 1028463 A1 | 8/2000 | |
| EP | 1256983 A2 | 11/2002 | |
| EP | 1895585 A2 | 3/2008 | |
| EP | 2040295 A2 | 3/2009 | |
| EP | 2268110 A1 | 12/2010 | |
| EP | 1548829 B1 | 10/2011 | |
| JP | H0770681 B2 | 7/1995 | |
| JP | H09148484 A | 6/1997 | |
| JP | 2001291893 A | 10/2001 | |
| KR | 102437933 B1 | 8/2022 | |
| WO | 2015173031 A1 | 11/2015 | |
| WO | 2015173032 A1 | 11/2015 | |

OTHER PUBLICATIONS

"Quad Flat No-leads package", printout of https://de.wikipedia.org/wiki/Quad_Flat_No_Leads_Package (engl. version).

* cited by examiner

3D FLEX-FOIL PACKAGE

CROSS-REFERENCE TO RELATED APPLICATIONS

This application claims priority from German Application No. 102019202721.0, which was filed on Feb. 28, 2019, and is incorporated herein by reference in its entirety.

BACKGROUND OF THE INVENTION

The invention relates to a foil-based package for an electronic device and, in particular, to an ultra-thin 3D flex-foil package comprising a recess where the electronic device is arranged at least in portions.

Nowadays, a very high number of electronic devices having standardized packages are available on the market. SMD (Surface Mount Device) packages or QFN (Quad Flat No Leads) packages, for example, and numerous other standardized forms are among these. For SMD packages, for example, there are standardizations for defining the geometry of the package as regards width, length and height. Additionally, the geometries of the electrical contact pads (SMD pads) are defined, where the signal path passes from the system environment, like a printed circuit board, to an interior semiconductor device, like a chip, for example.

In order to ensure compatibility of the signal paths, with equal functionalities of the SMD devices of different manufacturers, the order and geometrical position of the SMD pads are to comply with the standardization definition.

A second evolution in semiconductor devices (like chips) is for the number of IC (Integrated Circuit) contact pads to increase, partly up to more than several hundred pieces per chip, wherein the geometrical size of the IC pads and the distance between the IC pads decreases. The sum of the IC pad size and the distance therebetween is referred to as pad pitch.

Electrical contacting of such semiconductor chips comprising IC pads in a very small space is becoming increasingly difficult, even with most modern wire bond technologies. At the same time, larger amounts of heat have to be dissipated and higher electrical currents to be transmitted. Additionally, with increasing signal bandwidths, bond wires result in an attenuation or change in the signal shape, partly in interaction with neighboring bond wires, the mutual positioning among which is not tolerance-free due to precision bonding machines.

In the case of advanced packages, the requirements imposed by industry and the market continuously reducing the size and, above all, the structural height of electronic assemblies and at the same time increasing their performance with decreasing costs are to be complied with.

Nowadays, SMD types with terminal pins or without terminal pins are, for example, available on the market. SMD packages without terminal pins are characterized in that the electrical contact pads do not protrude considerably beyond the package body.

A common characteristic of such standardized packages is that the package height frequently is more than 300 µm and that the package does not exhibit any appreciable flexibility.

In the known technology, there are alternative methods for SMD in the form of wafer level packages (like wafer level chip scale package WL-CSP or fan-out wafer level packages), or else the integration density is increased by means of flip-chip assembly. Flip-chip is a collective term for expressing that the chip surface is assembled with the IC pads facing the substrate surface. In a standard SMD package, for example, the Si chip surface is assembled so as to face away from the lead frame substrate. In CSP, devices are formed the top view of which is largely identical with the Si chip area.

Among the newer methods and technologies for flip-chip assembly, there are machines optimized specifically for mounting (flip-chip bonders) and materials like ACA (anisotropically conductive adhesive) or ACF (anisotropically conductive adhesive film).

Additionally, the known technology encompasses terms like BGA (ball grid array), the grid dimension from ball to ball being in the range of 500 µm. The thickness (height) of such packages is more than 300 µm.

Consequently, it would be desirable to provide a package, the package height of which is reduced to a level which has not been provided so far using standardized packages (like SMD or QFN packages) and which nevertheless maintains compatibility with other standardized parameters, like conventional SMD standard parameters.

Additionally, it would be desirable to provide a thin package so that the system substrate, including the package mounted thereon, exhibits certain flexibility or bending properties which is improved compared to what is achieved at present in systems having standardized packages (like SMD or QFN packages) on printed circuit boards. The term flexibility refers to changes in shape from a planar area towards a cylindrical curvature, but not a dome-shaped deformation. Cylindrical curvatures occur in the flexibility specifications of smart cards, for example.

In order to pursue the goal of ultra-thin packages (having overall thicknesses of <150 µm) and additionally approach requirements as to costs for manufacturing in competition with established packaging fabrications, what is desired are few process steps, an efficient ordering of process steps and materials causing reduced costs.

Another object is avoiding layers and structures which are highly specialized in terms of manufacturing technology, for the entire manufacturing process.

SUMMARY

According to an embodiment, a foil-based package may have: at least one foil substrate having an electrically conductive layer arranged thereon, at least one electronic device having a device terminal side having at least one device terminal pad, wherein the electronic device is mounted on the electrically conductive layer with no bond wire in flip-chip mounting technology so that the device terminal side of the electronic device is arranged opposite the electrically conductive layer, a plurality of package terminal pads arranged on a package terminal side, for electrically contacting the package, wherein at least one package terminal pad is in contact with the electrically conductive layer so that the result is a signal path between the at least one package terminal pad and the electrically conductive layer and the at least one device terminal pad and so that the electronic device is electrically contactable from that side of the foil substrate facing the electronic device by means of the at least one package terminal pad, wherein the foil substrate has a first foil portion where the at least one package terminal pad is located, and wherein the foil substrate has a second foil portion where the electronic device is arranged, wherein the first foil portion extends along a first foil plane and wherein the second foil portion extends along a second foil plane parallel to the first foil plane, wherein the first foil plane and the second foil plane are offset relative to each other so that the foil substrate forms a recess within which the at least one electronic device is arranged, and a casting compound arranged between the first foil portion and the second foil portion, which encloses the plurality of package terminal pads at least in portions and covers the at least one electronic device to separate the electronic device from the surrounding environment.

According to another embodiment, a method for manufacturing a foil-based package may have the steps of: providing a foil substrate and arranging an electrically conductive layer on a first side of the foil substrate, providing an electronic device having a device terminal side having at least one device terminal pad, mounting the electronic device on the electrically conductive layer with no bond wire in flip-chip mounting technology so that the device terminal pad of the electronic device is arranged opposite the electrically conductive layer, contacting the electrically conductive layer by at least one package terminal pad from a plurality of package terminal pads arranged on a package terminal side, for electrically contacting the package, so that the result is a signal path between the at least one package terminal pad and the electrically conductive layer and the at least one device terminal pad and so that the electronic device is electrically contactable from that side of the foil substrate facing the electronic device by means of the at least one package terminal pad, wherein the foil substrate has a first foil portion which extends along a first foil plane and where the at least one package terminal pad is located, and wherein the foil substrate has a second foil portion which extends along a second foil plane parallel to the first foil plane and where the electronic device is located, introducing a permanent deformation into the foil substrate so that the first foil portion and the second foil portion are offset relative to each other and form a recess within which the at least one electronic device is arranged, and applying a casting compound between the first foil portion and the second foil portion so that the casting compound encloses the plurality of package terminal pads and covers the at least one electronic device to separate the electronic device from the surrounding environment.

The inventive foil-based package comprises at least one foil substrate comprising an electrically conductive layer arranged thereon. Additionally, the foil-based package comprises at least one electronic device comprising a device terminal side comprising at least one device terminal pad. The electronic device is mounted on the electrically conductive layer with no bond wire in flip-chip mounting technology so that the device terminal side of the electronic device is arranged so as to be opposite the electrically conductive layer. In addition, the foil-based package comprises a plurality of package terminal pads, arranged on a package terminal side, for electrically contacting the package, wherein at least one package terminal pad is in contact with the electrically conductive layer so that the result is a signal path between the at least one package terminal pad and the electrically conductive layer and the at least one device terminal pad and so that the electronic device is electrically contactable from that side of the foil substrate facing the electronic device by means of the at least one package terminal pad. In accordance with the invention, the foil substrate comprises a first foil portion where the at least one package terminal pad is arranged. In addition, the foil substrate comprises a second foil portion where the electronic device is arranged, the first foil portion extending along a first foil plane and the second foil portion extending along a second foil plane which is parallel to the first foil plane. The first foil plane and the second foil plane are offset relative to each other so that the result is a recess in the foil substrate within which the at least one electronic device is located. A casting compound which encloses the plurality of package terminal pads and covers the at least one electronic device and divides same from the environment is arranged between the first foil portion and the second foil portion.

This means that a package is provided which complies with conventional standardizations and at the same time comprises a considerably reduced structural height when compared to packages available at present. This can be realized due to the reduced layer thicknesses in the layer setup of the package and, in particular, due to the special substrate in the form of a foil, thereby additionally rendering the entire package flexible.

Embodiments provide for the foil substrate to comprise a foil layer thickness $D_F$ of less than 130 μm. Alternatively or additionally, further embodiments provide for the first electrically conductive layer to comprise a layer thickness $D_L$ of less than 20 μm. Alternatively or additionally, further embodiments provide for the electronic device to comprise an element thickness $D_C$ of less than 60 μm. Alternatively or additionally, further embodiments provide for the foil-based package to comprise an overall thickness $D_P$ of less than 300 μm.

BRIEF DESCRIPTION OF THE DRAWINGS

Embodiments of the present invention will be illustrated exemplarily in the drawings and will be discussed below, in which.

DETAILED DESCRIPTION OF THE INVENTION

Figure 1:
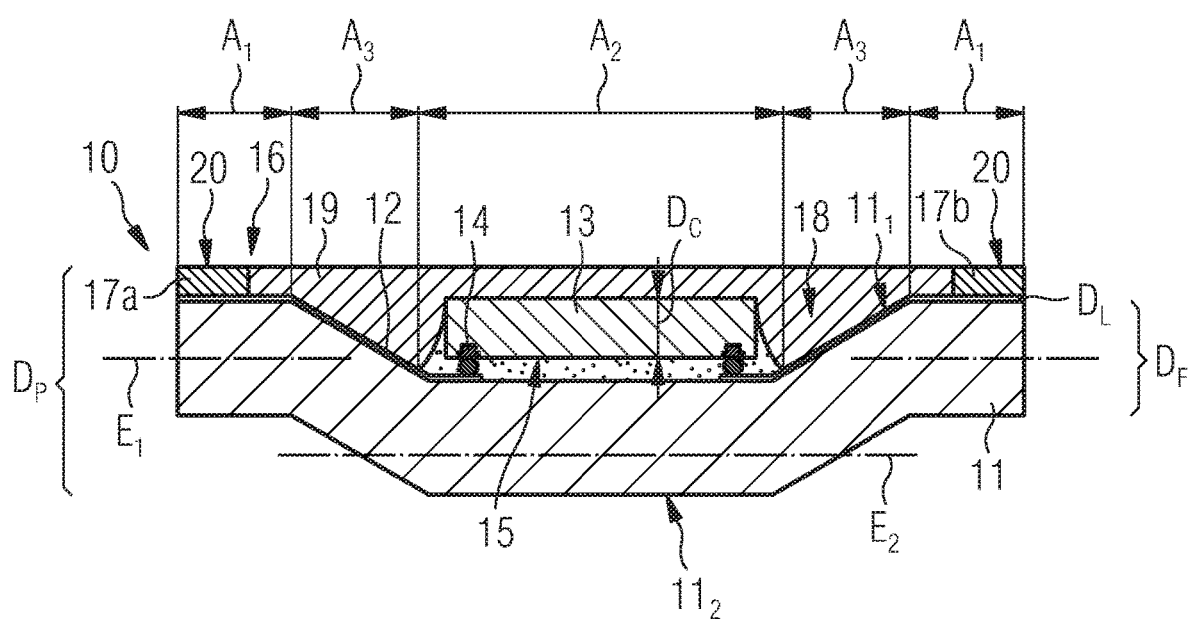
FIG. 1 is a schematic sectional side view of a foil-based package in accordance with an embodiment.

Embodiments will be described below in greater detail referring to the figures, wherein elements having same or similar functions are provided with the same reference numerals.

Method steps illustrated in a block diagram and discussed in connection with the same may also be performed in a different order than that illustrated or described. Additionally, method steps relating to a certain feature of an apparatus are interchangeable with this feature of the apparatus, also applying vice versa.

Additionally, a standardized package is described here exemplarily using the example of an SMD package or QFN package. However, the invention also relates to package forms complying with other standardizations.

The inventive foil-based package is also referred to as foil package, flex-foil package or 3D flex-foil package. In addition, the terms package and housing are used as synonyms. The term ultra-thin when referring to the foil-based package refers to thicknesses of less than 300 μm, advantageously to thicknesses of less than 200 µm and, even more advantageously, to thicknesses below 150 µm. The thickness corresponds to a layer thickness setup of the foil-based package perpendicularly to the main direction of extension of the foil substrate or perpendicularly to the foil planes. Substrates comprising layer thicknesses of less than 130 µm are also referred to as foil substrates, in the sense of the present invention.

Chips or semiconductor chips are mentioned as a non-limiting example of an electronic device 13. The description text exemplarily mentions chips which are embedded in a flex-foil package. The term "chip" encompasses implementations comprising a silicon material, other semiconductor substrates, thin glass or foil material. In particular, it must not be ignored that a foil device, which optionally may also provide a sensor functionality may be present instead of a "chip".

Non-limiting examples of sensor functions on a foil substrate may be interdigital capacitor patterns, amperometric electrodes, resistance meanders, light-sensitive, humidity-sensitive, gas-sensitive, pH-sensitive layers or bioanalytical layers.

A foil thickness of 25 µm, for example, is within the defined range of being named "thin chip". Since the manufacturing requirements for patterns on the foil chip may differ from the manufacturing requirements for package manufacturing, it may really be sensible to embed a foil chip into a flex package.

FIG. 1 shows a schematic sectional view of a foil-based package 10 in accordance with a first embodiment. The foil-based package 10 comprises at least one foil substrate 11. The foil substrate comprises a first side $11_1$ and an oppositely arranged second side $11_2$. An electrically conductive layer 12 is arranged on the foil substrate 11, more precisely on the first side $11_1$ of the foil substrate 11. The electrically conductive layer 12 comprises an electrically conductive material. The electrically conductive layer 12 may exemplarily be a metallization.

The terms "conductive layer" and "metallization" differ in that a metallization consists of a metal material (like aluminum, copper, chromium, nickel, gold), whereas a conductive layer may comprise electrically finitely low-resistance particles in a material compound (like silver particles in a paste material or spheres in the range of µm made of a non-conductive or poorly conductive material having a conductive surface coating). In the sense of the present disclosure, the term "conductive layer" forms the generic term for both variations, i.e. for both an electrically conductive layer and for a metallization.

The foil-based package 10 comprises at least one electronic device 13. The electronic device 13 may, for example, be an active or a passive electronic device. Exemplarily, the electronic device 13 may be a semiconductor chip. The electronic device 13 comprises a device terminal side 15. The device terminal side 15 comprises at least one device terminal pad 14 for electrically contacting the electronic device 13.

The electronic device 13 is mounted on the electrically conductive layer 12 with no bond wire in flip-chip mounting technology so that the device terminal side 15 of the electronic device 13 is arranged to be opposite the electrically conductive layer 12.

The foil-based package 10 comprises a package terminal side 16 from which the foil-based package 10 is electrically contactable. A plurality of package terminal pads 17a, 17b are arranged on the package terminal side 16. The package terminal pads 17a, 17b serve for electrically contacting the package 10 and/or the electronic device 13. Here, at least one package terminal pad 17a is in contact with the electrically conductive layer 12, the result being a signal path between the at least one package terminal pad 17a and the electrically conductive layer 12 and the at least one device terminal pad 14. Thus, the electronic device 13 is electrically contactable from that first side $11_1$ of the foil substrate 11 facing the electronic device 13 by means of the at least one package terminal pad 17a.

The package terminal pads 17a, 17b comprise a terminal-side terminal or contact area 20. Surface treatment of these contact areas 20 is conceivable in order to improve contacting.

The foil substrate 11 comprises a first foil portion $A_1$ where the at least one package terminal pad 17a is arranged. The foil substrate 11 comprises a second foil portion $A_2$ where the electronic device 13 is arranged. In the example illustrated here, the foil substrate 11 comprises two first foil portions $A_1$ which are located at respective opposite lateral exteriors of the foil substrate 11. At least one package terminal pad 17a, 17b is arranged at each of the two first foil portions $A_1$. A second foil portion $A_2$ is spatially arranged between the two first foil portions $A_1$.

The first foil portion $A_1$ extends along a first foil plane $E_1$. The second foil portion $A_2$ extends along a second foil plane $E_2$ parallel to the first foil plane $E_1$. The first foil plane $E_1$ and the second foil plane $E_2$ are consequently offset and spaced apart in parallel relative to each other. This means that the foil substrate 11 forms a recess 18 within which the at least one electronic device 13 is arranged.

It can be recognized that the first foil portion $A_1$ and the second foil portion $A_2$ of the foil substrate 11 and a connective portion $A_3$ of the foil substrate 11 connecting the first and second foil portions $A_1$, $A_2$, comprise an essentially constant layer thickness. Alternative embodiments provide for the first foil portion $A_1$ and the second foil portion $A_2$ to comprise different layer thicknesses, for example when the second foil portion $A_2$ is thinned due to deformation.

In addition, the foil-based package 10 comprises a casting compound 19 arranged between the first foil portion $A_1$ and the second foil portion $A_2$. The casting compound 19 encloses the plurality of package terminal pads 17a, 17b at least in portions. Advantageously, the casting compound 19 laterally surrounds the package terminal pads 17a, 17b completely, with the exception of a surface or terminal or contact area 20 on the package terminal side 16. In addition, the casting compound 19 covers the at least one electronic device 13, advantageously completely, and divides the electronic device 13 from the environment.

This setup, which may be performed in thin-layer technology, results in an ultra-thin foil-based package 10 which is flexible and complies with conventional standardizations.

In accordance with embodiments, the entire foil-based package 10 may comprise an overall thickness $D_P$ of less than 300 µm. This offers the possibility of the entire package 10 to comprise a flexible behavior and to be bent in an elastically deformable manner. Flexibility here refers to changes in shape of a planar area towards a cylindrical curvature, but not a dome-shaped deformation. A cylindrical curvature is, for example, comprised in the flexibility specifications of smart cards.

In addition, the foil substrate 11 may advantageously comprise a foil layer thickness $D_F$ of less than 130 µm.

The first electrically conductive layer 12 may advantageously comprise a layer thickness $D_L$ of less than 20 µm.

The electronic device 13 may advantageously comprise an element thickness $D_C$ of less than 60 µm.

The entire foil-based package 10 may comprise an overall thickness $D_P$ of less than 300 μm.

FIGS. 2A to 2G show an exemplary process flow describing how the foil-based package 10 can be produced. FIGS. 2A to 2G are purely schematic and not to scale, i.e. the figures are not scaled geometrically as is the case in a real implementation. In order to make the layer sequence and the borders of layers among one another clear, the layer thicknesses are illustrated in an enlarged manner. The lateral dimensions are partly represented in a shortened manner.

Figure 2A:
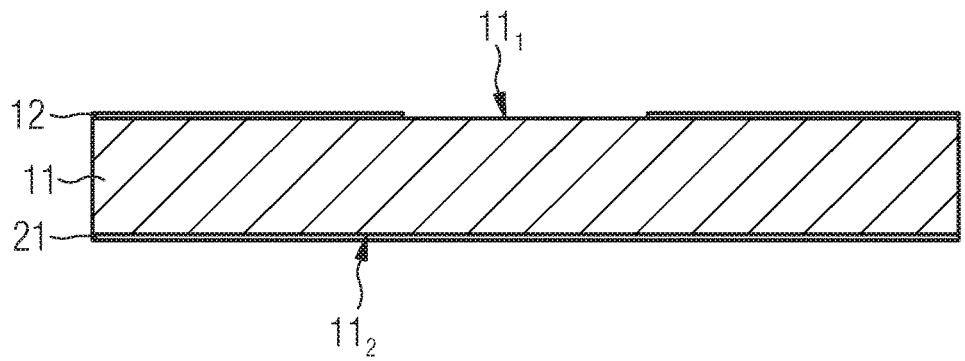
FIGS. 2A-2G are schematic sectional side views for illustrating a manufacturing method of a foil-based package in accordance with an embodiment.

FIG. 2A shows a foil substrate 11. The foil substrate 11 comprises a first main side $11_1$ and an oppositely arranged second main side $11_2$. A first electrically conductive layer 12 is applied to the surface of the first main side $11_1$, for example by means of deposition. The electrically conductive layer 12 can be patterned, thereby forming portions of electrically low-resistance characteristics, for example conductive trace patterns. "Electrically low-resistance", in the sense of the present disclosure, means an order of magnitude which is at most in a one-digit range of ohms per square, a square corresponding to a square as a part of the electrically conductive layer.

The electrically conductive layer 12 can be patterned such that the result are signal paths separated (i.e. electrically isolated among one another) from the device terminal pads 14 (IC pads), directed outwards towards the edge of the foil package 10. The sequence of sketches exemplarily illustrates an arrangement where the signal paths reach to the package edge. This is not necessarily the case, which means that the electrically conductive layer 12 may be at a certain distance to the package edge.

The electrically conductive layer 12 may consist of several layer parts, maybe differing in size range, wherein the border layer to the foil substrate 11 may exhibit a characteristic of good adhesion to the electrically conductive layer 12. Differing in size range here exemplarily means a relation of a 40 nm adhesive layer relative to a 400 nm or 4.000 nm thickness of the electrically conductive layer 12. Such relations may frequently occur in the layer parts of the electrically conductive layer 12.

Optionally, a material layer 21 may be applied to the surface of the opposite second main side $11_1$ of the foil substrate 11. Exemplarily, an external coating with a material layer 21 may be applied to the second main side $11_2$ of the foil substrate 11 opposite the electrically conductive layer 12, which may be characterized by its barrier characteristic from external influences, like humidity or electromagnetic radiation, like light. This means that the material layer 21 may exemplarily be implemented as a barrier coating for protection against humidity or against electromagnetic radiation. If the barrier characteristic is low-resistance conductivity, the coating 21 may function as electrical shielding. Shielding with no connection to a supply voltage potential only serves as an equipotential area or magnetic shielding, whereas shielding with a connection to a supply voltage potential represents an electrical alternating-field shield.

Another exemplary embodiment which, however, is not illustrated here explicitly, provides an electrical connection (through contacting or via) between the coating 21 and the electrically conductive layer 12. There may be one via, or more than one via, wherein the geometrical position can be selected in such a way that the desired electrical connection to the patterned region forms in the electrically conductive layer 12. The external coating 21 may consist of several layer parts, wherein there may be conductive and non-conductive layer parts.

In summary, FIG. 2A shows that a first protective layer 21 can be applied to a surface $11_2$ of a foil substrate 11 (top side, for example) and that a first electrically conductive patterned layer 12 (like metallization) can be generated on another surface $11_1$ of the foil substrate 11 (like lower side). This means that an electrically conductive patterned layer 12 which is relatively thin with values in the order of magnitude of approximately 10 μm, is generated on the foil substrate 11. In specific embodiments, an order of magnitude of approximately 10 μm exemplarily means 4 μm or 5μ or 6 μm or 7 μm or 8 μm or 9 μm or 12 μm.

Figure 2B:
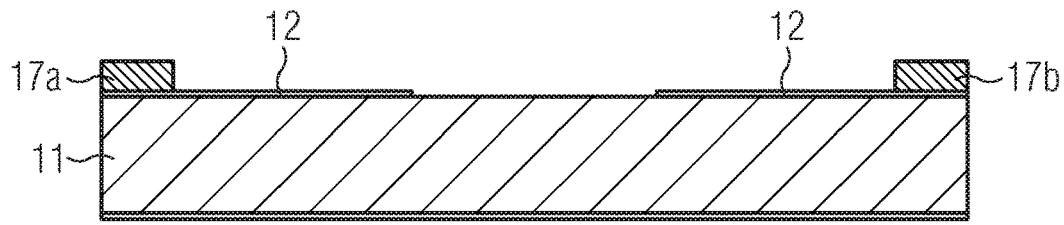

FIG. 2B shows another conceivable method step, producing a plurality of (in this case exemplarily two) package terminal pads 17a, 17b. Here, a second electrically conductive layer may be arranged, like deposited, on the first electrically conductive layer. The second electrically conductive layer may correspondingly be patterned such that the package terminal pads 17a, 17b illustrated will form. The package terminal pads 17a, 17b are arranged on the first electrically conductive layer 12 and galvanically connected to the first electrically conducting layer 12.

In summary, FIG. 2B shows applying a second electrically conductive layer on the first electrically conductive layer 12 or foil substrate 11. The second electrically conductive layer can be patterned by means of patterning methods so that the result is a patterned layer which will take the function of package terminal pads 17a, 17b. The geometrical arrangement of this patterned second electrically conductive layer, or of the package terminal pads 17a, 17b, can comply with standardization requirements. This means that, in interaction between the chip thickness and the overall arrangement of an ultra-thin flex package 10, another electrically conductive patterned layer is produced which may take the geometries of the package terminal pads 17a, 17b. This further electrically conductive layer may, for example, be generated in an additive electroplating or galvanic technology.

A considerable different to conventional lead frames in packages is that the chip 13 is not arranged on a lead frame. This is part of the solution for the low overall thickness of the ultra-thin flex package 10.

Another considerable difference to conventional package structures is that the flexibility of the foil substrate 11, including the electrically conductive layer 12, is made use of in accordance with the invention in order to generate a three-dimensional configuration (3D flex package). The topographical shaping may be realized in a simple implementation for packages complying with the duel-in-line (DIL) standard. Since a topographical bending of the foil substrate 11 occurs only in one dimension (theoretically comparable to corrugated sheet iron), it can be ensured that no dome-shaped deformation takes place. A somewhat more complex solution which complies with the quad-flat-pack (QFP, QFN) standard, for example, and at the same time avoids the dome-shaped deformation, is that, starting from the corner regions of the central region where the one or several semi conductive chips 13 are arranged, at least one section of the foil substrate 11 is performed per corner region, which reaches the external corner regions of the package 10. What results is (theoretically comparable to the side parts of a folded box) sub-regions of the foil substrate 11 which are flexible in one dimension each, but where one dimension is implemented in the x direction and the other dimension in the y direction.

Another considerable difference is the flexibility of the electronic device 13. When thinning a silicon material, for example, down to an order of magnitude of approximately 50 µm, the silicon material will obtain a certain bending characteristic. When reducing the thickness of the silicon substrate of a semiconductor chip 13, for example, bending stress and bending radii may be matched to one another such that no Si chip breaking will occur but nevertheless a function can be obtained which cannot be achieved using rigid devices. In applications like Smart Cards, for example, having integrated electronics, this function may be of great importance.

The phrase mentioned in connection with thinning silicon of "approximately 50 µm" may, for example, be 60 µm or 50 µm or 40 µm or 30 µm or 15 µm or a similar value.

Figure 2C:
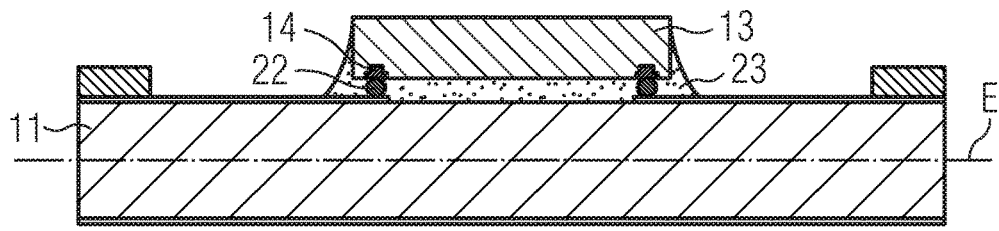

FIG. 2C shows the arrangement of an electronic device 13 on the foil substrate 11. The electronic device 13 may, for example, comprise an integrated circuit (IC) or a semiconductor chip. The electronic device 13 is coupled to the first electrically conductive layer 12 in an electrically conducting manner. This may, for example, be performed by means of suitable metallizations. Exemplarily, bump metallizations 22 which topographically protrude beyond the passivation surface of the electronic device 13 may be located on the device terminal pads 14 (like IC pads).

A conductive pattern which topographically protrudes from the metallization of the device terminal pad 14 (IC pad) beyond the surface of the IC passivation is referred to as bump 22 so that the bumps 22 in the order of magnitude of 2 µm or 3 µm or 4 µm, for example, represent a topography on the IC pad-side surface.

The geometrical measure by which the bumps 22 protrude topographically depends on the technology using which the bumps 22 are generated. In so-called UBM technology, the topography is, for example, <10 µm, in pillar technology >10 µm, or in stud-bump technology >20 µm, for example. In order to realize the object of a thin foil package, advantages will result when using technologies of small topographic dimensions for the bumps 22.

Consequently, there is an electrical signal connection between an IC bump 22 and the electrically conductive coating 12 (like metallization) in the foil package 10, which advantageously is realized in a low-resistance manner by providing one or several conductive elements in the mounting process of the electronic device 13 on the foil substrate 11 between the surfaces of the bumps 22 and the surface of the electrically conductive coating 12, or a direct low-resistance contact between a bump 22 and the electrically conductive coating 12. Such conductive elements are present in, for example, mounting materials, like anisotropically conductive adhesives or anisotropically conductive adhesive foils, for example, as is indicated in FIG. 2C by the reference numeral 23. When setting up the foil package 10, that surface of the electronic device 13 comprising the bumps 22 faces that surface of the foil substrate 11 which comprises the electrically conductive layer 12 (so-called flip-chip orientation). There are no bond wires present.

The variation mentioned where there is a direct low-resistance contact between a bump 22 and the electrically conductive layer 12 has no specific figure of its own since only the additional mounting material 23 which, in FIG. 2C, is located between a bump 22 and the electrically conductive layer 12, for example, is replaced by the low-resistance contact path or the direct contact between the pillar, for example, and the electrically conducive layer 12.

The pillar here refers to a metallic structure, the lateral dimension of which is smaller than the area of the device terminal pad 14 (IC pad) and the height of which may be in the order of magnitude of 10 µm or 15 µm or 20 µm or 25 µm or 30 µm, for example.

As is also represented in FIG. 2C, the electronic device 13 may be mounted on the first electrically conductive layer 12 with no bond wire in flip-chip mounting technology, for example. Among the newer methods and technologies for flip-chip assembly, there are machines optimized specifically for mounting (flip-chip bonders) and materials like ACA (anisotropically conductive adhesive) or ACF (anisotropically conductive adhesive film). Such a mounting material 23, like ACA or ACF, may be arranged between the electronic device 13 and the electrically conductive layer 12.

In the case of ACA or ACF technology, chip mounting material 23 and chip contact material are a common material system. In the case of stud bumps 22 or pillar technology, these are separate materials.

Additionally, it can be recognized in FIG. 2C that the foil substrate 11 basically extends along a foil plane E.

For reasons of completeness, it is to be mentioned here that, in the figure sequence illustrated, only one metallization is illustrated in the region of the device terminal pad 14 (IC pad), although real semiconductor chips may contain several metallization layers.

Figure 2D:
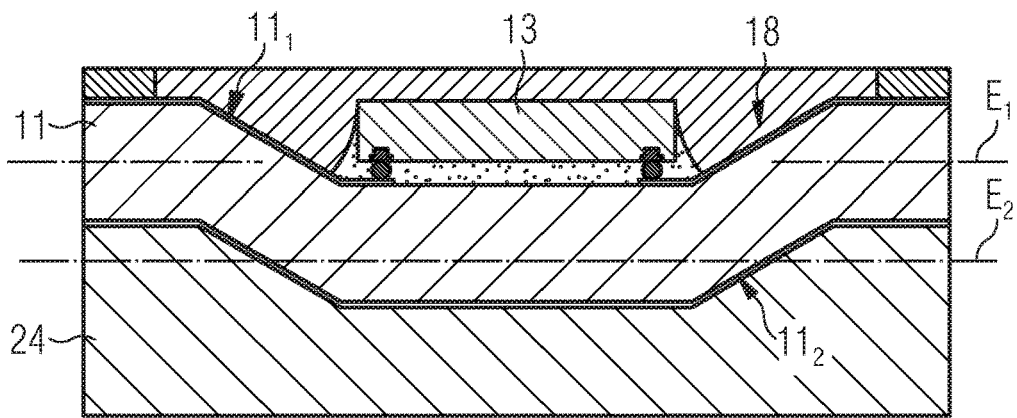

FIG. 2D shows another method step where the recess 18 in which the electronic device 13 is arranged is generated. Here, the foil substrate 18 may be deformed plastically. This means that the foil substrate 11, as seen from the electronic device 13, can be deformed in the direction towards the second main side $11_2$ (that side facing away from the electronic device 13) of the foil substrate 11. This may exemplarily be realized by placing the up to then semi-finished arrangement (i.e. the still unfinished foil-based package 10) in a profile molded part 24 and performing an embedding process. After cross linking the embedding material, the molded part 24 can be removed again.

Shaping of the 3D flex arrangement, in FIG. 2D, is only exemplarily achieved by a profile molded part 24 (a so-called chuck) which theoretically functions as a template into which the flex-foil semi-finished article is placed for the embedding process. Implementing the profile molded part 25 with no sharp edges, but bending radii is of advantage.

A micromechanical force, which can be considered when dimensioning the geometries of the 3D flex-foil package 10 is impressed to the flex-foil semi-finished article by the bending process. The micromechanical forces can be kept small when the bending radii are sufficiently large.

By deforming the semi-finished product, or foil substrate 11, the foil substrate 11 forms a recess 18 within which the electronic device 13 is arranged. As can be recognized in FIG. 2D, the foil substrate 11 no longer extends only along a single foil plane, but along two mutually parallel offset foil planes $E_1$, $E_2$. As seen from the electronic device 13, the recess 18 extends in a direction pointing towards the foil substrate 11, so that the result is a three-dimensional indentation where the electronic device 13 is arranged on that side $11_1$ of the foil substrate 11 facing the electronic device. The recess 18 or indentation forms a three-dimensional topology in the foil substrate 11. For this reason, the inventive foil-based package 10 is also referred to as 3D flex-foil package.

Figure 2E:
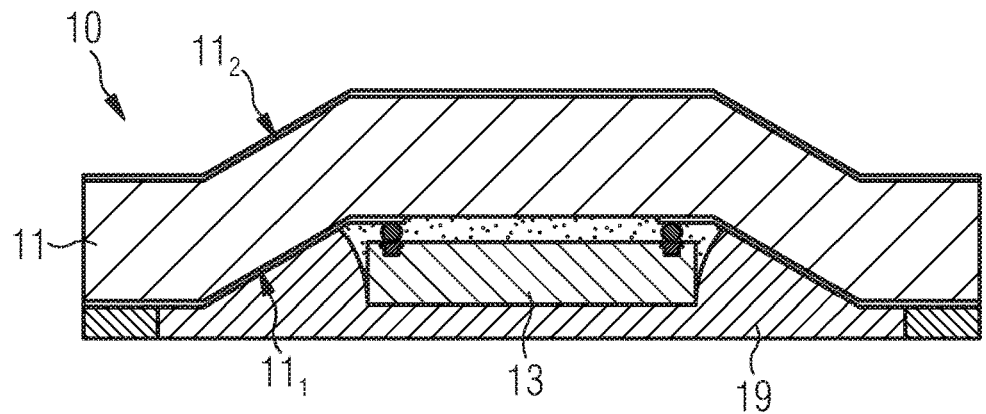

FIG. 2E shows a typical installation position for the assembly of the 3D flex-foil package 10 in a system environment. The pin arrangement of this package 10 may advantageously be configured to be compatible with the pin arrangement of standard packages, without requiring any re-wiring. This complies with several aspects of the object mentioned before.

In addition, FIG. 2E shows a casting compound 19 which is applied in every step following after the deformation 18. The casting compound 18 covers the electronic device 13 advantageously completely.

FIG. 2E thus shows the finished foil-based package 10. The foil package 10 is formed on a foil substrate 11, wherein the thickness of the foil substrate 11 may, for example, be 125 μm or 50 μm or 25 μm or less than 25 μm. Polyimide (Pi) or polyethylene naphthalate (PEN) or polyethylene terephthalate (PET) or polycarbonate (PC) or different materials are possible foil materials. Selecting the material advantageously depends on which temperatures act on the foil substrate 11, both when manufacturing the foil package 10 and also in the mounting process of the foil package 10 in a system. The temperatures will continue to act in the application due to the operating states of the foil package 10 (operating temperatures).

Figure 2F:
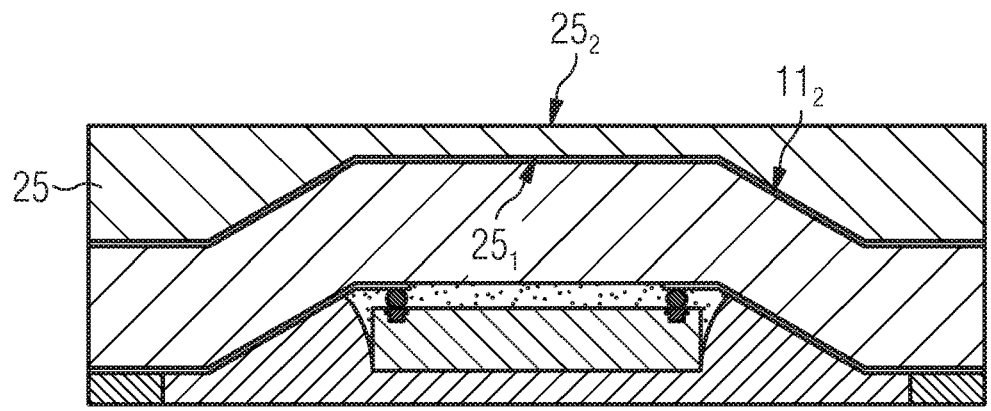

FIG. 2F shows an optional additional step where another material layer 25 is applied to the surface of the second main side $11_2$ (that side facing away from the electronic device 13).

The further material layer 25 may, for example, be a casting compound. The further material layer 25 may, for example, be arranged on the barrier coating 21. The further material layer 25 can compensate the difference in height in the foil substrate 11 caused by the three-dimensional deformation 18. In addition, the further material layer 25 may comprise a planar surface on its side $25_2$ facing away from the foil substrate 11. In other words, a material layer 25 may be arranged on that side $11_2$ of the foil substrate 11 facing away from the electronic device 13, the material layer 25 comprising a first side $25_1$ facing that side of the foil substrate 11 facing away from the electronic device 13, and the material layer 25 comprising a second side $25_2$ facing away from that side $11_2$ of the foil substrate 11 facing away from the electronic device 13, wherein the second side $25_2$ of the material layer 25 comprises a planar surface. Optionally, as is illustrated in FIG. 2F, a second embedding process can be performed where the corresponding topography is leveled to the first embedding (FIG. 2D). A protective function against environmental influences can be achieved by the second embedding.

Figure 2G:
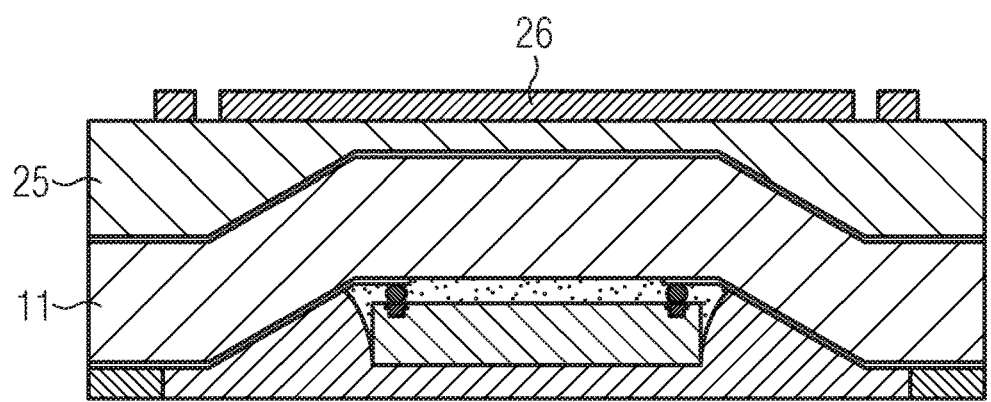

FIG. 2G shows another optional additional step where another layer 26 is arranged on the material layer 25. The further layer 26 may, for example, be a further protective layer or labelling. Optionally, as is illustrated in FIG. 2G, a further layer 26 which exemplarily corresponds to a labelling of the device can be applied.

Figure 3:
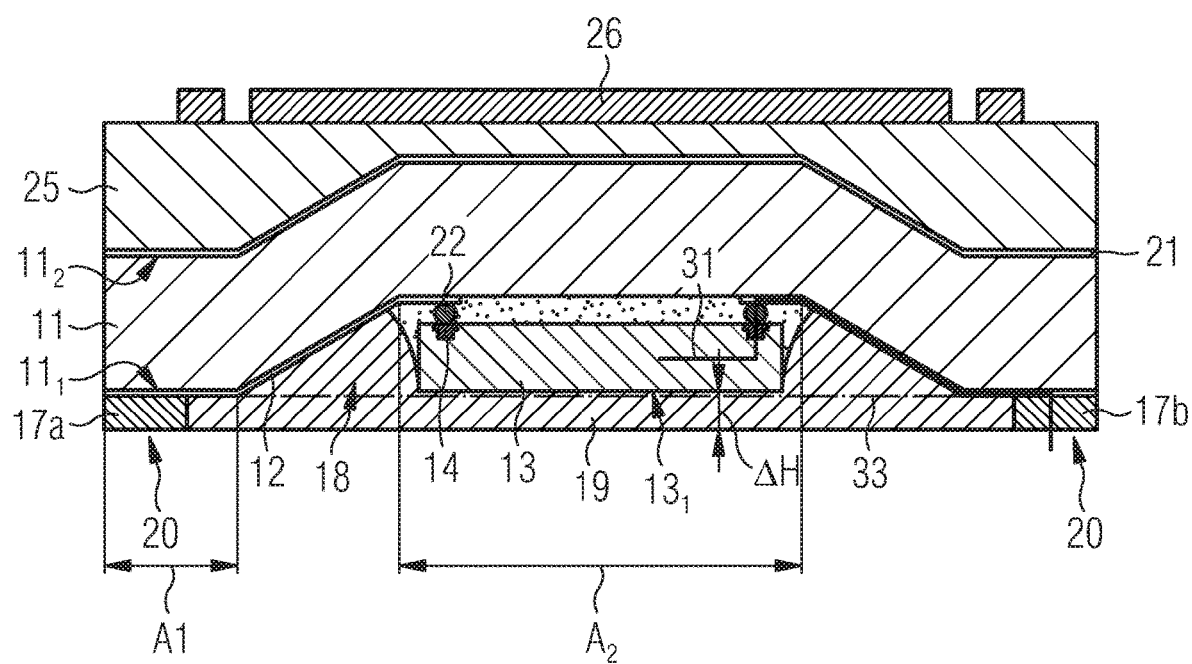
FIG. 3 is a schematic sectional side view of a foil-based package in accordance with an embodiment.

FIG. 3 shows a schematic view of an embodiment of a foil-based package 10, including an exemplarily illustrated signal path 31. As has been mentioned before, the first material layer 21, the second material layer 25 and the further layer 26 are optional.

The signal path 31 is to be described at first. When starting with the chip electronics, i.e. from the electronic device 13, a signal passes the device terminal pad 14 (IC pad), including a bump 22, which topographically protrudes beyond the passivation plane of the chip surface. Representing the different possible connecting technologies (ACA, ACF, Pillar, StudBump, SLID (solid liquid interdiffusion)) or the like, a connective element between the electronic device 13 and the electrically conductive layer 12 (like metallization) on a first surface $11_1$ of the foil substrate 11 is conceivable.

Subsequently, the signal path 31 passes along the electrically conductive layer 12 and further on to the package terminal pad 17b. Optionally, there may be at least one signal path from an electrically conductive, external cover layer 21 on the second surface $11_2$ of the foil substrate 11 to the electrically conductive layer 12. For reasons of simplicity, a specific through-contacting or via is not illustrated as a separate figure. This electrical connection may be connected to a supply voltage potential so that the external layer 21 may correspond to an electrical alternating-field shield.

The external cover layer 21 on the second surface $11_2$ of the foil substrate 11 may consists of several layers, wherein electrically conductive or electrically non-conductive layer portions are possible.

Without being illustrated in a separate figure, another embodiment can result when the optional second embedding material 25 is topographically located at the same level as the three-dimensional, elevated cover layer 21, with the advantage of a smaller overall structural height of the package 10.

In accordance with the invention, the electronic device 13 is arranged in the recess 18. Thus, the electronic device 13 can be arranged in the recess 18 completely, or at least partly.

As can be recognized in FIG. 3, the foil substrate 11, in the first foil portion $A_1$, comprises a foil surface facing the package terminal pads 17a, 17b. This foil surface defines a level symbolized using the line 33.

The electronic device 13 comprises a device surface $13_1$ arranged opposite the device terminal side. This device surface $13_1$ is located either at/on the height of this level 33 (i.e. the height of the surface of the first foil portion $A_1$ facing the package terminal pads 17a, 17b) or below. In both cases, the electronic device would be arranged completely within the recess 18.

The package terminal pads 17a, 17b comprise a terminal area 20 for electrical contacting on their side facing away from the foil substrate 11. As can be recognized in FIG. 3, a difference in height ΔH is present between the terminal areas 20 of the package terminal pads 17a, 17b and the electronic device 13 or the device surface $13_1$ mentioned above. The casting compound 19 here is arranged at the foil-based package 10 such that it compensates for this difference in height ΔH between the terminal area 20 of the at least one package terminal pads 17a, 17b arranged in the first foil portion $A_1$ and the electronic device 13 arranged in the second foil portion $A_2$.

In some embodiments, the casting compound 19 may be flush with the terminal area 20 of the at least one package terminal pad 17a, 17b or flush with a respective plurality of terminal areas 20 of the plurality of package terminal pads 17a, 17b. Flush in this case means that the casting compound 19 and the package terminal pads 17a, 17b are located on the same horizontal height level.

The real technical implementation may not exhibit such a precise flushness in a region remote from the package terminal pads 17a, 17b, due to manufacturing-technological circumstances.

Figure 4A:
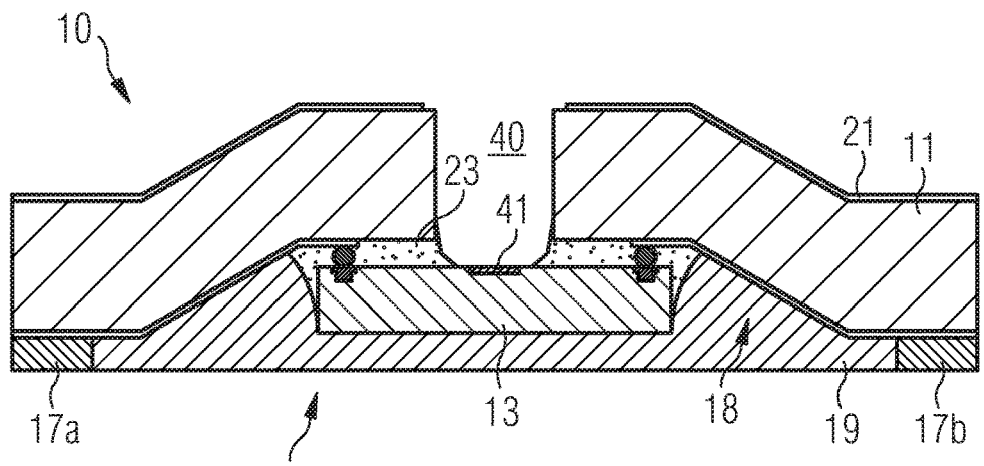
FIGS. 4A-4C are schematic sectional side views of a foil-based package comprising a media access opening in accordance with an embodiment.
Figure 4B:
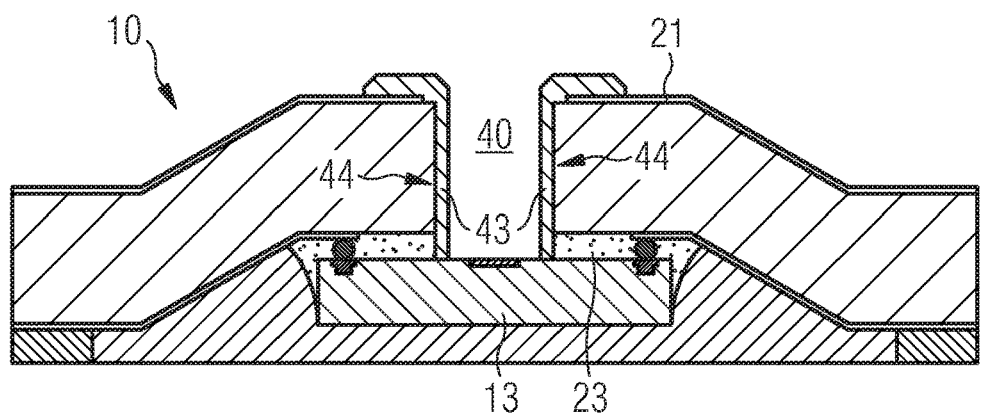
Figure 4C:
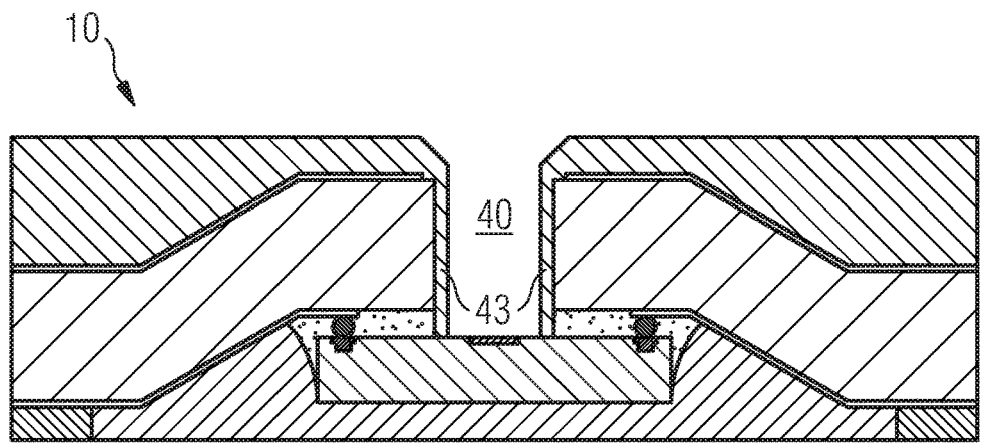

FIGS. 4A, 4B and 4C show further embodiments of a foil-based package 10, these embodiments each comprising a media access opening.

Basically, different forms of sensor chips are known which can roughly be subdivided into those sensor functions not requiring media contact for detecting sensor signals, and those sensor functions for which media contact is entailed. An acceleration sensor is an example of a sensor function with no media contact.

An example of a sensor function with media contact may be a medical analysis sensor which contacts a serum (medium) to be examined by means of sensors on the chip surface so as to generate a sensor signal.

In the context of flex-foil packages, optical sensors may also be considered to be sensors with media contact, since, depending on the optical transparency of the foil material, contact with the "optical radiation" medium can be possible with or without a media access opening in the foil material.

FIGS. 4A to 4C show such a media access opening 40 in the foil-based package 10 so that the medium (analyte) to be examined allows contact to the chip surface in such a way that the interaction between the medium and the chip 13 is suitable for generating sensor signals.

FIGS. 4A to 4C show a schematic sectional view of the conceptional arrangement of layers. It is to be considered in particular that the lateral geometrical relations (dimensions) are not illustrated to scale relative to the layer thicknesses. In the case of a uniform scale, the layer thicknesses in ultra-thin packages 10 would be so small in relation to the lateral dimensions of the chips 13 or package 10 that the layer sequence could no longer be comprehensible.

Conversely, in FIGS. 4A to 4C, the region with which the chip surface can contact the medium appears laterally too small. However, the conceptional arrangement is comprehensible in detail.

At first, FIG. 4A shows a foil-based package 10 comprising an opening 40. Since the opening 40 allows contact between a medium to be examined, or analyte, and the electronic device 13, the opening 40 is also referred to as media access opening.

The foil-based package 10 consequently comprises an opening 40 which may extend completely through the foil substrate 11 to the electronic device 13, so that the electronic device 13 can be brought into contact with an environment through this opening 40, at least in portions.

The opening 40 advantageously extends perpendicularly to the main direction of extension of the foil substrate 11 or perpendicularly to the foil plane (see, among others, FIG. 1). It is also of advantage for the opening 40 to extend through the foil substrate 11 to the electronic device 13 in the shortest manner possible. Here, the opening 40 may be arranged in a region of the foil substrate 11 which is opposite the electronic device 13, for example. The opening 40 may additionally extend through the foil substrate 11 with no interruption and basically linearly.

If the foil-based package 10 comprises the optional material layer 21 on that side of the foil substrate 11 facing away from the electronic device, the opening 40 may also extend through this material layer 21. The diameter of the opening 40 within the foil substrate 11 may be smaller than or equal to the diameter of the opening 40 in the material layer 21.

This means that the recess or opening 40 in the optional material layer 21 on the second (external) surface of the foil substrate 11 exemplarily is suitably greater than the opening 40 in the foil substrate 11 so as to visualize that, depending on the manufacturing method of the opening 40 in the foil substrate 11 and the recess 40 in the optional material layer 21, there may be no edge coverage of the optional material layer 21 at the opening 40 of the foil substrate 11.

This lateral distance between the optional material layer 21 and the edge of the opening 40 in the foil substrate 11 is to be understood to be only a non-limiting example. In the 3D foil package 10, the optional material layer 21 may advantageously be manufactured before producing the media opening 40, and patterned suitably so that the illustrated lateral distance can be omitted.

If the foil-based package 40 comprises a mounting material 23, the opening 40 may also extend through this mounting material 23. The illustrated detail shows that, when mounting the thin electronic device 13 (chip) at the edge to the foil-substrate opening 40, the mounting material 23 may be fitted correspondingly.

As can be recognized in FIG. 4A, the electronic device 13 may comprise a sensor area which is also referred to as sensor portion 41. The sensor portion 41 is implemented so as to provide a sensor functionality based on contacting a medium present in the environment, wherein the opening 40 exposes at least the sensor portion 41 so that the sensor portion 41 can be brought into contact with the medium present in the environment through this opening 40.

Examples of sensor functions with media contact may be a humidity sensor package, or a gas sensor or a fluid sensor (liquid analytics) or a medical sensor.

The opening 40 in the foil substrate 11 may comprise suitably larger dimensions than corresponds to the sensor area 41 on the chip surface.

Advantageously, the opening 40 is arranged on a side of the foil-based package 10 opposite the package terminal side 16. Thus, the foil-based package 10, with its package terminal side 16, can be connected to and contacted on another support (not illustrated here), like a substrate or an element, for example, so that the opening 40 is arranged to be opposite the support. This means that the opening 40 would be located on the top side of the foil-based package 10 when being mounted on the support and contacted. Thus, free accessibility of the medium to be measured, or analyte, to the sensor portion 41 of the electronic device 13 can be ensured. Expressed differently, electrical contacting of the foil-based package 10 takes place on that package side 16 facing away from the side having media contact.

The 3-dimensional shaping described before, i.e. producing the recess 18, in the micrometer range, may contribute to the fact that, depending on the mounting situation of the system, flow patterns in the medium are disturbed by the package typography a little less than is the case in rectangular packages.

FIG. 4B shows another example of a foil-based package 10. This embodiment differs from the embodiment described referring to FIG. 4A in that, among other things, the opening 40 is lined with a material layer 43.

The material layer 43 may be particularly arranged at lateral sidewalls 44 of the opening 40 extending through the foil substrate 11. Alternatively or additionally, the material layer 43 can be arranged on that side of the foil substrate 11 facing away from the electronic device 13. If the optional material layer 21 is present, the material layer 43 can also be arranged on this optional material layer 21.

The material layer 43 may particularly represent the function of a protective coating for protecting the chip mounting material 23 from chemical reactions (solvent) with the medium to be measured. This means that, for protecting the chip mounting material 23 from chemical reactions (solvent) with the medium to be measured, there may be a separation between the medium and the chip mounting material 23, which, in FIG. 4B, is illustrated by the lining, reaching to the chip surface, of the foil opening 40 by means of the material layer 43. Conversely, the chemical characteristic of the chip mounting material 23 may have a disadvantageous effect on sensitive substances in the medium (like antibodies in blood serum) so that a protective layer, for example in the form of the material layer 43, may be of advantage.

The material layer 43 may thus also be referred to as media protective material, wherein the form of the media protective material 43 here is illustrated only as an example of a plurality of conceivable implementations. However, it is essential for the media protective material 43 to prevent media from having an effect on the chip mounting material 23.

FIG. 4C shows another example of a foil-based package 10, wherein the material layer 43 for lining the foil opening 40 up to the chip surface serves at the same time to shape the package surface. This means that the material layer 43 may have the same functionality as the material layer 25 described before referring to FIG. 3. It is also conceivable for the material layer 25 to be used for lining the opening 40.

Figure 5:
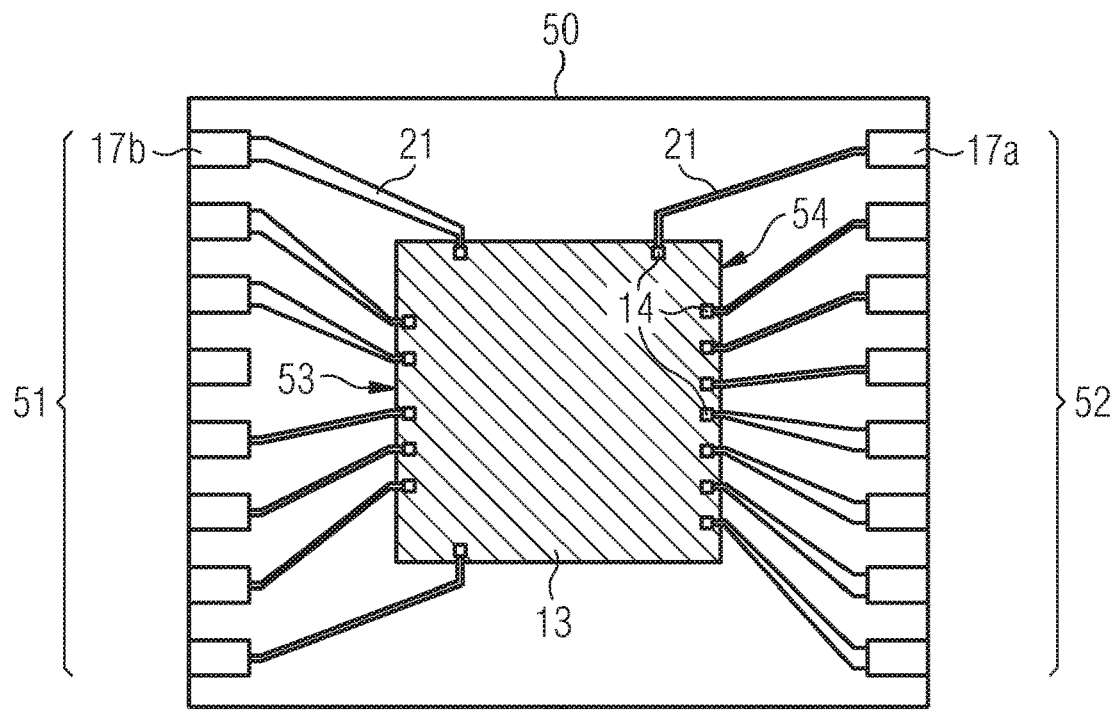
FIG. 5 is a top view of an embodiment of a topology of a foil-based package in accordance with an embodiment.

FIG. 5 shows a schematic top view of an exemplary topology within a foil-based package 10, the outlines of which are represented by the reference numeral 50. A plurality of package terminal pads are arranged along the package outlines 50, wherein two reference numerals 17a, 17b are provided to represent the plurality of package terminal pads.

The electronic device 13 here is exemplarily illustrated as a semiconductor chip 13. The at least one thinned semiconductor chip 13 may be arranged in a central region of the package 10. If there is more than one semiconductor chip 13, there may be direct connections from one semiconductor chip to anther semiconductor chip (no connection to the package pads 17a, 17b).

The semiconductor chip 13 comprises a plurality of device terminal pads 14, wherein the reference numeral 14 is provided to represent the plurality of device terminal pads. The arrangement of the device terminal pads 14 in the 3D foil package 10 here is not limited strictly to the lateral edge regions of the semiconductor chip 13.

The arrangement of the device terminal pads 14 in the 3D foil package 10 is not limited strictly to those lateral regions of the semiconductor chip 13 which are opposite the package terminal pads 17a, 17b either. As can be seen schematically from FIG. 5, there are degrees of freedom for placing the device terminal pads 14 as long as planar wiring of the device terminal pads 14 to the package terminal pads 17a, 17b is possible.

The plurality of device terminal pads 14 and the plurality of package terminal pads 17a, 17b may be connected among one another by means of conductive trace patterns 21. The conductive trace patterns 21 may, for example, be produced by suitably patterning the electrically conductive layer 21. The shape of the connective conductive traces can be implemented in dependence on technical criteria (like current density) or be designed freely.

The geometrical shape of the conductive trace patterns 21 in the region of the device terminal pads 14 may overlap the area of the device terminal pads 14 (i.e. the area as device terminal pad 14), or it may cover only a sub-area of the device terminal pads 14. In particular, when the distance among the device terminal pads 14 is very small (15 µm, for example), one advantageous embodiment is for the conductive trace patterns 21 in the region of the device terminal pads 14 to consume only part of the area of the device terminal pads 14.

The device terminal pads 14 are arranged at a relatively small distance to the chip edge, wherein the following cases may arise:
a) The number of device terminal pads 14 is greater than the number of package terminal pads 14a, 14b. The result is that either certain device terminal pads 14 have no connection to the package terminal pads 17a, 17b, or else sometimes more than one device terminal pad 14 has a connection 21 to a common package terminal pad 17a, 17b.
b) The number of device terminal pads 14 equals the number of package terminal pads 17a, 17b. There may be a 1-to-1 association of device terminal pads 14 to package terminal pads 17a, 17b.
c) The number of device terminal pads 14 is smaller than the number of package terminal pads 17a, 17b. A consequence is that package terminal pads 17a, 17b remain with no connection to device terminal pads 14, or that more than one package terminal pad 17a, 17b has a connection to a common device terminal pad 14.

The package terminal pads 17a, 17b are geometrically arranged such that the size of the package terminal pads 17a, 17b and the distance among the package terminal pads 17a, 17b may comply with technical standardizations. Exemplarily, the foil-based package may be implemented to be a Quad Flat No Leads—QFN—package or a Surface Mount Device—SMD—package.

As can be seen in FIG. 5, a plurality of package terminal pads 17a, 17b may be laterally spaced apart from the electronic device 13, wherein the individual package terminal pads 17a, 17b of the plurality of package terminal pads are arranged, in the sense of a dual-in-line configuration, along precisely two rows 51, 52, wherein the precisely two rows 51, 52 are arranged along two opposite sides 53, 54 of the electronic device 13, which laterally pass around the electronic device 13. The precisely two rows 51, 52 advantageously are parallel to the laterally circumferential sides 53, 54 of the electronic device 13. A dual-in-line arrangement consequently comprises precisely two rows 51, 52 of package terminal pads 17a, 17b at opposite contour regions 50 of the package 10.

This embodiment shown in FIG. 5 also comprises the three-dimensional recess 18 described before, within which the electronic device 13 is arranged. However, this recess 18 is not to be seen directly in FIG. 5, since this is a top view.

The three-dimensional recess 18 is located in the region between the package terminal pads 17a, 17b region and the electronic device 13 region. Advantageously, there are only straight bending lines, advantageously parallel bending lines.

Figure 6:
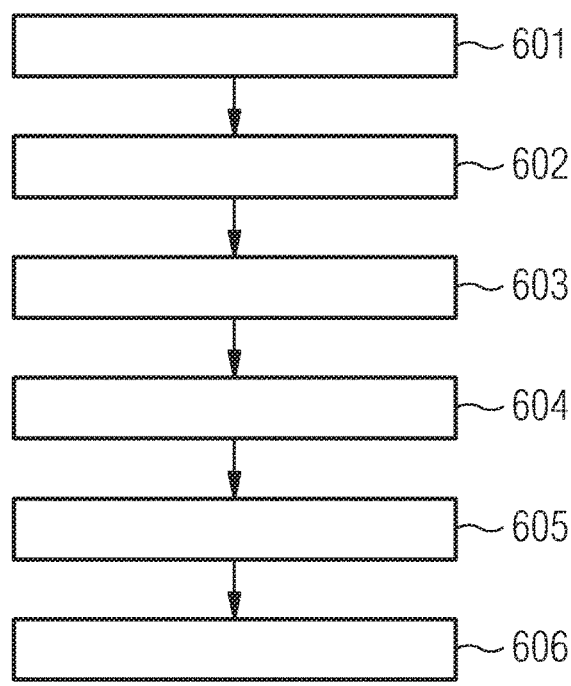
FIG. 6 is a block diagram of a method for manufacturing a foil-based package in accordance with an embodiment.

FIG. 6 shows a schematic block diagram of an inventive method for manufacturing a foil-based package 10.

In block 601, a foil substrate 11 is provided and an electrically conductive layer 12 is arranged on one side $11_1$ of the foil substrate 11.

In block 602, an electronic device 13 comprising a device terminal side 15 comprising at least one device terminal pad 14 is provided.

In block 603, the electronic device 13 is mounted on the electrically conductive layer 21 in no-bond-wire flip-chip mounting technology so that the device terminal side 15 of the electronic device 13 is arranged opposite the electrically conductive layer 21.

In block 604, the electrically conductive layer 21 is contacted by at least one package terminal pad 14 of a plurality of package terminal pads 17a, 17b arranged on a package terminal side 16, for electrically contacting the package 10 so that the result is a signal path 31 between the at least one package terminal pad 17a, 17b and the electrically conductive layer 21 and the at least one device terminal pad 14 and so that the electronic device 13 is electrically contactable from that side of the foil substrate 11 facing the electronic device 13 by means of the at least one package terminal pad 17a, 17b, wherein the foil substrate 11 comprises a first foil portion $A_1$ which extends along a first foil plane $E_1$ and where the at least one package terminal pad 17a, 17b is arranged, and wherein the foil substrate 11 comprises a second foil portion $A_2$ which extends along a second foil plane $E_2$ parallel to the first foil plane $E_1$ and where the electronic device 13 is arranged.

In block 605, a permanent deformation is introduced into the foil substrate 11 so that the first foil portion $A_1$ and the second foil portion $A_2$ are offset relative to each other and form a recess 18 within which the at least one electronic device 13 is arranged.

In block 606, a casting compound 19 is applied between the first foil portion $A_1$ and the second foil portion $A_2$ so that the casting compound 19 surrounds the plurality of package terminal pads 17a, 17b and covers the at least one electronic device 13 and divides same from the environment.

Advantageously, this method can be executed as a roll-to-roll method, wherein the foil substrate 11 is wound onto a roll, unwound and equipped and the finished foil-based package 10, after being equipped, is wound again to form a roll.

The flexible foil-based package 10 described here exhibits numerous advantages over conventional, in particular rigid, package forms.

The foil-based package 10 is flexible in that the foil-based package 10 is bendable with no destruction being caused, and in particular with no damage to the electronic device 13, wherein a bending radius $R_B$ is greater by at least 100 times than a thickness $D_P$ of the foil-based package 10. All in all, the ultra-thin 3D flex-foil package 10 allows moderate bending since ultra-thin electronic devices 13, like ultra-thin semiconductor chips having a thickness of approximately 50 µm, for example, can resist such bending without breaking.

Using the ultra-thin 3D flex-foil package, an overall height in the range of, for example, 50 µm to 150 µm can be achieved, i.e. the thickness $D_P$ of the foil-based package 10 may be between 50 µm and 150 µm.

The electronic device 13 (chip) can be integrated between the foil substrate 11 and an embedding layer 19 (casting compound) so that environmental influences act on the chip 13 in an only strongly reduced manner, on the one hand, and, on the other hand, with functionally moderate bending stress, the mechanical stress acting on the chip 13 is so small that there is no chip breaking.

In a 3D flex-foil package 10, several electronic devices 13, like chips, for example, can be connected among one another within the package 10 by means of conductive traces. At least part of all the device terminal pads 14 (IC pads) may also be connected to external package terminal pads 17a, 17b.

The manufacturing sequence does not require any chemical process steps on the external surface of the embedding material 19, which is of particular advantage when process chemicals containing acids or basic process chemicals would act on the embedding material 19.

The foil-based package disclosed here may additionally be realized in the following embodiments, wherein the examples mentioned below may all be combined with the other embodiments of the foil-based package described herein:

In accordance with a first further embodiment, a foil-based package for surface mounting is suggested, the foil-based package comprising at least one foil substrate, at least one electronic device, and a first electrically conductive layer arranged between the electronic device and the foil substrate, the first electrically conductive layer being applied to a side of the foil substrate facing the electronic device and connecting the electronic device in an electrically conducting manner to at least one terminal pad guided outside to a package terminal side, for surface mounting the foil-based package so that the electronic device is electrically contactable from that side of the foil substrate facing the electronic device.

In accordance with a second further embodiment, a foil-based package in accordance with any of the embodiments described herein is suggested, wherein the electronic device is a thin glass or electronic chip comprising a foil material or a semiconductor chip comprising a semiconductor material, or the electronic device is a foil element implemented to provide a sensor function.

In accordance with a third further embodiment, a foil-based package in accordance with any of the embodiments described herein is suggested, wherein the electronic device comprises at least one element from the group of interdigital capacitor patterns, amperometric electrodes, resistance meanders, light-sensitive and/or humidity-sensitive and/or gas-sensitive and/or pH-sensitive layers and/or bioanalytical layers.

In accordance with a fourth further embodiment, a foil-based package in accordance with any of the embodiments described herein is suggested, wherein the at least one terminal pad comprises a surface coating layer.

In accordance with a fifth further embodiment, a foil-based package in accordance with any of the embodiments described herein is suggested, wherein the foil substrate comprises a polyimide layer, a polyethylene naphthalate layer, a polyethylene terephthalate layer and/or a polycarbonate layer.

In accordance with a sixth further embodiment, a foil-based package in accordance with any of the embodiments described herein is suggested, wherein the electronic device is connected electrically to the first electrically conductive layer by means of an electrically conductive solder connection or by means of an adhesive connection comprising an anisotropically electrically conductive adhesive.

In accordance with a seventh further embodiment, a foil-based package in accordance with any of the embodiments described before is suggested, wherein the first foil portion and the second foil portion are parallel to each other.

In accordance with an eighth further embodiment, a foil-based package in accordance with any of the embodiments described herein is suggested, wherein the foil-based comprises an opening which extends completely through the foil substrate to the electronic device, so that the electronic device can be brought into contact with an environment through this opening at least in portions, and wherein the electronic device comprises a sensor portion implemented to provide a sensor functionality based on contacting with a medium present in the environment, wherein the opening exposes at least the sensor portion so that the sensor portion can be brought into contact with the medium present in the environment through this opening.

In accordance with a ninth further embodiment, a foil-based package in accordance with the eighth embodiment is suggested, wherein the sensor layer comprises at least one sensor for detecting a liquid, a gas or for detecting incident light.

In accordance with a tenth further embodiment, a foil-based package in accordance with the eighth or ninth embodiment is suggested, wherein the opening extends through the foil substrate perpendicularly to the first and/or second foil plane.

In accordance with an eleventh further embodiment, a foil-based package in accordance with the eighth, ninth or tenth embodiment is suggested, wherein the opening is arranged within the footprint of the electronic device. The outer contours of the electronic device visible in top view, for example, are referred to as footprint.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A flexible foil-based package comprising:
at least one flexible foil substrate comprising an electrically conductive layer arranged thereon, the at least one flexible foil substrate comprising a foil layer thickness $D_F$ of less than 130 μm,
at east one electronic device comprising a device terminal side comprising at least one device terminal pad,
wherein the at least one electronic device is mounted on the electrically conductive layer with no bond wire in flip-chip mounting technology so that the device terminal side of the at least one electronic device faces the electrically conductive layer,
a plurality of package terminal pads being arranged on a package terminal side of the flexible foil-based package, the plurality of package terminal pads being configured for electrically contacting the flexible foil-based package,
wherein at least one package terminal pad of the plurality of package terminal pads is in contact with the electrically conductive layer
such that a signal path is provided between the at least one package terminal pad and the electrically conductive layer and the at least one device terminal pad, and
such that the at least one electronic device is electrically contactable from a side of the at least one flexible foil substrate that faces the at least one electronic device by means of the at least one package terminal pad,
wherein the at least one flexible foil substrate comprises a first foil portion at which the at least one package terminal pad is arranged, and wherein the at least one flexible foil substrate comprises a second foil portion at which the at least one electronic device is arranged,
wherein the first foil portion extends along a first foil plane and wherein the second foil portion extends along a second foil plane that is parallel to the first foil plane,
wherein the first foil plane and the second foil plane are offset relative to each other such that the at least one flexible foil substrate forms a recess within which the at least one electronic device is arranged,
wherein the first foil portion comprises a foil surface facing the plurality of package terminal pads, wherein said foil surface defines a foil surface level,
wherein the at least one electronic device comprises a device surface opposite the device terminal side, wherein said device surface is located at or below said foil surface level such that the at least one electronic device is arranged completely within the recess, and
wherein the flexible foil-based package further comprises a casting compound arranged between the first foil portion and the second foil portion, wherein the casting compound surrounds at least a portion of the plurality of package terminal pads and covers the at least one electronic device in order to separate the electronic device from a surrounding environment.

2. The flexible foil-based package in accordance with claim 1,
wherein the electrically conductive layer comprises a layer thickness $D_L$ of less than 20 μm, and/or
wherein the at least one electronic device comprises an element thickness $D_C$ of less than 60 μm, and/or
wherein the flexible foil-based package comprises an overall thickness $D_P$ of less than 300 μm.

3. The flexible foil-based package in accordance with claim 1, wherein the first foil portion and the second foil portion of the at least one flexible foil substrate, as well as a connecting portion of the at least one flexible foil substrate, which connects the first foil portion with the second foil portion, each comprise an essentially constant layer thickness, or
wherein the first foil portion and the second foil portion each comprise a different layer thickness.

4. The flexible foil-based package in accordance with claim 1, wherein the recess, when viewed from the at least one electronic device, extends in a direction towards the at least one flexible foil substrate thereby forming a three-dimensional indentation on the side of the at least one flexible foil substrate that faces the at least one electronic device, and wherein the at least one electronic device is arranged in said indentation.

5. The flexible foil-based package in accordance with claim 1, wherein the at least one electronic device comprises a device surface arranged opposite the device terminal side, wherein the device surface is arranged at or below a level defined by a surface of the at least one package terminal pad.

6. The flexible foil-based package in accordance with claim 1, wherein the at least one package terminal pad of the plurality of package terminal pads comprises a terminal area facing away from the at least one flexible foil substrate, and wherein the casting compound is configured to compensate a difference in height LH between the terminal area of the at least one package terminal pad arranged in the first foil portion and the at least one electronic device arranged in the second foil portion.

7. The flexible foil-based package in accordance with claim 6, wherein the casting compound is flush with the terminal area of the at least one package terminal pad, or wherein the casting compound is flush with a respective plurality of terminal areas of the plurality of package terminal pads.

8. The flexible foil-based package in accordance with claim 1, wherein a barrier coating for protection against humidity or against electromagnetic radiation is arranged on a side of the at least one flexible foil substrate that faces away from the at least one electronic device.

9. The flexible foil-based package in accordance with claim 1, wherein a material layer is arranged on a side of the at least one flexible foil substrate that faces away from the at least one electronic device,
the material layer comprising a first side facing the side of the at least one flexible foil substrate that faces away from the at least one electronic device, and
the material layer comprising a second side that faces away from the side of the at least one flexible foil substrate that faces away from the at least one electronic device, and
wherein the second side of the material layer comprises a planar surface.

10. The flexible foil-based package in accordance with claim 1, the flexible foil-based package comprising an opening extending completely through the at least one flexible foil substrate to the at least one electronic device such that at least a portion of the at least one electronic device can be brought into contact with an environment through this opening.

11. The flexible foil-based package in accordance with claim 10, wherein the at least one electronic device comprises a sensor portion configured to provide a sensor functionality based on contacting to a medium present in the environment, wherein the opening exposes at least the sensor portion so that the sensor portion can be brought into contact with the medium present in the environment through this opening.

12. The flexible foil-based package in accordance with claim 10, wherein the opening is arranged on a side of the flexible foil-based package opposite the package terminal side.

13. The flexible foil-based package in accordance with claim 10, wherein a material layer is arranged at lateral side walls of the opening extending through the at least one flexible foil substrate.

14. The flexible foil-based package in accordance with claim 1, wherein the flexible foil-based package is bendable with no destruction caused, and in particular with no damage to the at least one electronic device, wherein a bending radius $R_B$ is greater than a thickness $D_P$ of the flexible foil-based package by at least 100 times.

15. The flexible foil-based package in accordance with claim 1, the flexible foil-based package being configured as a Quad Flat No Leads—QFN—package or as a Surface Mount Device—SMD—package.

16. The flexible foil-based package in accordance with claim 1, wherein the plurality of package terminal pads is spaced apart laterally from the at least one electronic device, and wherein individual package terminal pads of the plurality of package terminal pads are arranged in the sense of a dual-in-line configuration along precisely two rows, wherein the precisely two rows are arranged along two opposite sides of the at least one electronic device laterally encircling the at least one electronic device.

* * * * *